United States Patent [19]

Eckes et al.

[11] 4,412,133
[45] Oct. 25, 1983

[54] ELECTROSTATIC CASSETTE

[75] Inventors: William A. Eckes, Berkeley; Russell H. Rhoades, Palo Alto; John W. Vorreiter, Sunnyvale; John C. Wiesner, Hayward; Charles E. Shepard, San Jose, all of Calif.

[73] Assignee: The Perkin-Elmer Corp., Norwalk, Conn.

[21] Appl. No.: 337,205

[22] Filed: Jan. 5, 1982

[51] Int. Cl.³ .................... H02N 13/00; H01J 37/30
[52] U.S. Cl. ............................ 250/492.2; 250/442.1; 361/234
[58] Field of Search ............... 250/442.1, 491.1, 492.2, 250/310; 361/234; 269/903

[56] References Cited

U.S. PATENT DOCUMENTS 3,983,401 9/1976 Livesay .......................... 250/492.2
3,993,509 11/1976 McGinty ....................... 250/492.2

FOREIGN PATENT DOCUMENTS

WO79/00510 8/1979 PCT Int'l Appl. ................ 361/234

OTHER PUBLICATIONS

Juras, Jr. et al., "Electrostatic Holding Fixture for Flatness of a Nonrigid Sheet in Vacuum," *IBM Technical Disclosure Bulletin*, vol. 21, No. 11, Apr. 1979.

*Primary Examiner*—Alfred E. Smith
*Assistant Examiner*—T. N. Grigsby
*Attorney, Agent, or Firm*—S. A. Giarratana; T. P. Murphy; J. R. Dwyer

[57] ABSTRACT

An electrostatic cassette assembly comprising, a cassette body having a central opening for receiving a wafer to be processed in a particle beam lithographic system, a charge plate with a top surface having a coating of dielectric (nonconductive) material or a plurality of nonconductive means, or both, on which the wafer is supported, means for forcing said charge plate and wafer into contact with stop means to hold the wafer rigidly in said cassette assembly, and means for applying a potential difference between the wafer and the charge plate to flatten said wafer by Coulombic force so that the wafer is held both mechanically and electrostatically in said cassette assembly. Means are also provided for insuring a good electrical contact with the wafer and for aligning the wafer in the cassette assembly.

14 Claims, 14 Drawing Figures

ELECTROSTATIC CASSETTE

BACKGROUND OF THE INVENTION

1. Prior Art

U.S. Pat. No. 3,983,401 entitled "Method and Apparatus for Target Support in Electron Projection Systems" by W. R. Livesay dated Sept. 28, 1976.

An article entitled "Electrostatic Wafer Chuck for Electron Beam Microfabrication" by George Wardly, Rev. Sci. Instrum., Vol. 44, No. 10, October, 1973 (cited in the Livesay Patent, supra).

U.S. Pat. No. 3,900,737 entitled "Electron Beam Exposure System" by Collier, et al., dated Aug. 19, 1975.

U.S. Pat. No. 3,801,792 entitled "Electron Beam Apparatus" by Lin dated Apr. 2, 1975.

U.S. Pat. No. 4,189,230 entitled "Wafer Holder with Spring-Loaded Wafer Holding Means" by Zasio, dated Feb. 19, 1980.

2. Field of the Invention

This invention relates, in general, to a new and improved apparatus (wafer cassette) for supporting and securing target wafers for exposure to a particle beam in particle beam lithographic systems.

The above Wardly article explained the technique of using an electrostatic chuck in microfabrication applications using Coulombic forces to support and flatten a target wafer. The wafer was supported on a backing plate electrode with an insulator (dielectric) therebetween with a potential difference applied to the wafer and to the backing plate electrode.

The above Patent to Livesay explained at length the problems involved in supporting and securing target wafers in electron image projection systems and in electron pattern generator systems utilizing an electron beam deflection. For further explanation of the operation of electron beam pattern generating systems, see also the Patents to Collier, et al. and Lin, supra.

The chuck of the Livesay Patent, like the chuck of the Wardly article, placed a wafer on a dielectric which in turn is supported on a flat wafer support and applied a bias voltage across the dielectric layer to flatten the wafer. The target wafer is in an electron accelerating electric field. Also disclosed is a wafer support means which included a lip extending over the edges of the wafer for minimizing the electric field distortion due to the presence of the target support in an electron accelerating field in an image projection system. This latter wafer support, however, did not use Coulombic forces to flatten the wafer.

The Zasio Patent illustrated a wafer holder which spring loaded the wafer against a flange (mechanical stop) and several means to index (align) the wafer in the holder but did not use the Coulombic force concept to flatten the wafer.

Notwithstanding the prior art, there still exists a need for electrostatic chuck by which a wafer is held both mechanically and electrostatically which includes means by which the wafer can be removed and replaced within a very close tolerance for the numerous steps in the process of fabrication of integrated circuits and which includes means for positively forming a good electrical connection to the wafer.

SUMMARY OF THE INVENTION

The invention which meets the foregoing needs and is an improvement over the prior art is an electrostatic cassette assembly comprising, a cassette body having a central opening for receiving a wafer to be processed in a particle beam lithographic system, a charge plate having a top surface with a coating of dielectric material or a plurality of nonconductive pins or both on which the wafer is supported, resilient means for forcing said charge plate and wafer into contact with stop means whereby the wafer is held rigidly and mechanically in said cassette assembly, and means for applying a potential difference between the wafer and the charge plate to flatten said wafer by Coulombic force so that the wafer is held both mechanically and electrostatically in said cassette assembly.

The assembly also includes means for insuring a good electrical contact with the wafer and means for properly aligning the wafer in the cassette assembly. Also disclosed is a method of loading and unloading of the wafer from the cassette and the cassette from the particle beam lithographic systems.

DETAILED DESCRIPTION

Figure 1:
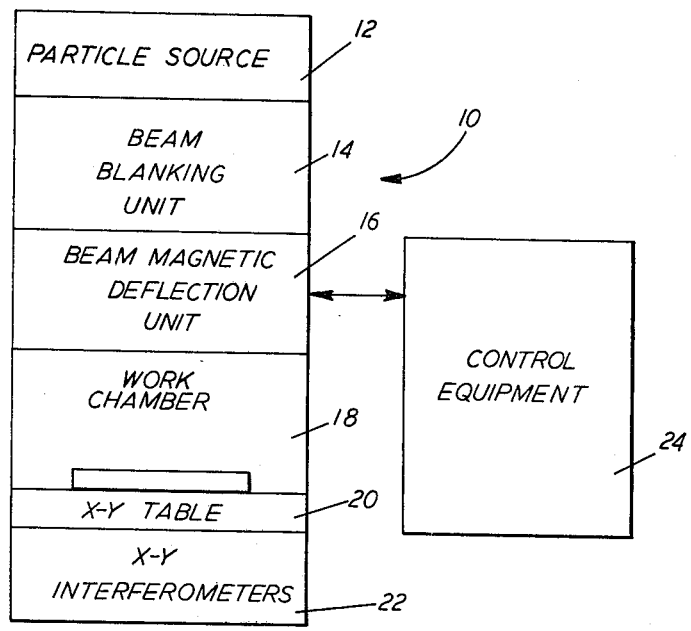
FIG. 1 illustrates systematically a particle beam lithographic system in which this invention may be incorporated.

Turning first to FIG. 1, there is illustrated a typical particle beam deflection system 10 in which the present invention may be utilized. The illustrated system is similar to the electron beam system of the Collier, et al. Patent, supra, and comprises a particle source 12 for forming a particle beam, a beam blanking unit 14 for turning the beam on and off for writing purposes, a beam deflection unit 16 for deflecting a beam typically in a raster scan fashion, a work chamber 18 usually at very low air pressure, an X-Y table 20 which moves in a direction at right angles to the movement of the deflected particle beam but in synchronism therewith, X-Y interferometers 22 for precisely determining the position of the beam and table, and a control equipment unit 24 containing the data for moving the particle beam and the table in accordance with a predetermined pattern.

Figure 2:
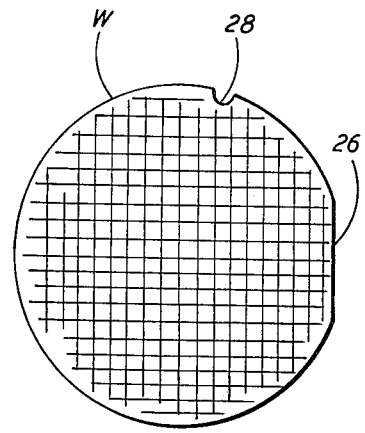
FIG. 2 is a plan view of a conventional wafer utilized in the fabrication of integrated circuits.

FIG. 2 illustrates a typical semiconductor target wafer W with a segment removed to form an edge 26 for alignment purposes. Some wafers will also have a notch, such as notch 28, formed in their periphery a distance from the edge 26 also for alignment purposes. The wafer is conventionally of a doped silicon covered by an insulating layer and the wafer is coated with a resist material to be irradiated by the particle beam to form a mask. The wafer W may also have alignment marks on its top surface to index the wafer electronically in the system.

Figure 4:
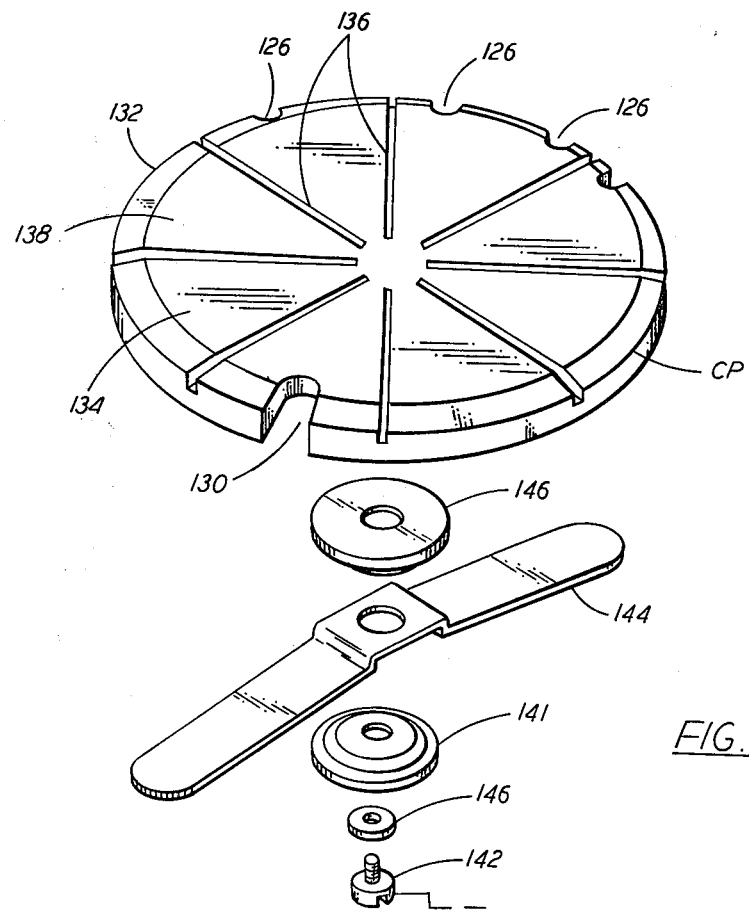
FIG. 4 is an isometric view exploded view of the charge plate assembly of this invention.
Figure 3:
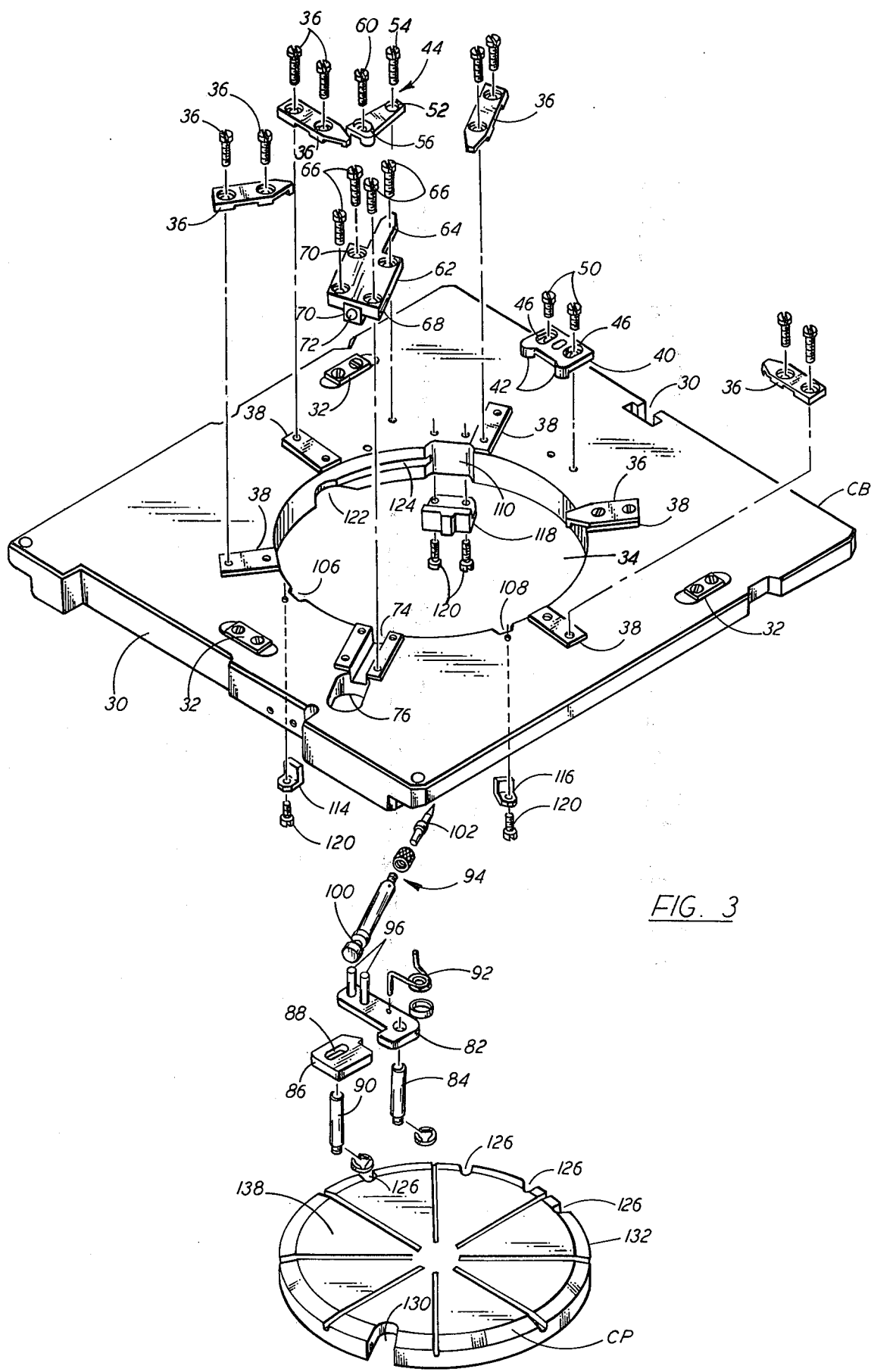
FIG. 3 is an isometric exploded view of the various elements forming the electrostatic cassette of this invention.

As shown in FIGS. 3 and 4, the electrostatic cassette assembly of this invention comprises basically two parts: a cassette body CB and a charge plate CP to support and secure the target wafer W appropriately in a particle beam lithographic system such as that shown in FIG. 1. Cassette body CB and charge plate CP are conventionally of non-magnetic material.

The cassette body CB is a parallelopiped, essentially square, and thick enough to receive the wafer W and the charge plate CP. The outer periphery of the body is provided with an indexing means in the form of notches 30 to cooperate with complementary indexing means on the X-Y table 20 of the lithographic system such as 10 to align the cassette assembly in the X-Y table. The top of the cassette body also has a plurality of tungsten reference means 32 which locate the cassette body in the Z axis (same direction as the direction of the particle beam). In practice, these reference points 32 control the Z registration to within 2 micrometers and are of tungsten to reduce wear. The body is also provided with central opening 34 transverse the main plane of the body. The opening 34 is large enough to accept the wafer W and the charge plate CP, the diameter of the latter being substantially equal to the diameter of the wafer. A plurality of inwardly directing retainers 36, suitably affixed to the top wall of the body as by screws, act as stop means or retainers for the top surface of the wafer when the latter is placed in the body. (One of the retainers 36 is shown in position in FIG. 3.) Actually, the retainers are positioned on raised portions 38 to minimize the area that is required to meet the 0.0001 inch flatness requirement. This makes the body easier to manufacture. Indexing means or register 40 with fingers 42 also extend into the opening 34 to engage the edge 26 of wafer W thereby aligning the wafer with respect to the cassette body. The body is also provided with an indexing means or register 44 which is inwardly directed into the opening 34 to engage the wafer edge. Indexing means 40 has radially directed slots 46 for receiving tightening screws 50 which enable the indexing means to be adjustable relative to the center of the opening 34 and the indexing means 44, while pivotally mounted on the body at 52 by screw 54, also has a radially directed slot 56 to receive a tightening screw 60. The latter slot and screw combination also allows adjustment of the indexing means 44 relative to the opening center. On the side of the opening 34 opposite the indexing means 40 is a large retainer 62 with an inwardly directed finger 64 which, like retainers 34, engage the top of the wafer. This large retainer is attached to the top side of the body by a plurality of screws 66 (four shown) and will be described in more detail. As will be apparent also, this retainer also includes a means for electrically connecting the wafer to the cassette body.

The retainer 62, in the embodiment shown in FIG. 3 is T-shaped in cross section with the horizontal portion 68 containing suitable apertures for receiving the aforementioned tightening screws 66 to attach the retainer to the top surface of the cassette body. The horizontal portion 70 of the retainer is bored as at 72 and received in a groove 74 formed in the cassette body. In position, the bore 72 is directed radially inwardly and opening into the opening 34. Also, the cassette body is formed with an oblong opening 76 extending through the body and opening into a recess 80 formed in the bottom side of the body to receive the remainder of the retaining means which includes the aforementioned means for electrically connecting the wafer to the cassette body. The oblong opening 76 permits access to a portion of the electrical connecting means. This electrical connecting means comprises a latchable lever 82 pivotally connected to the cassette body by pivotal pin 84, a latch 86 slidably connected to the cassette body by oblong slot 88 and pin 90, spring means 92 for biasing the lever 82 and wafer connecting pin 94 connected to said lever by way of pins 96 engageable in a groove 100 in the pin body. One end of the spring is connected to the lever 82 and the other to the cassette body. The wafer connecting pin 94, (shown in three pieces with point 102 preferably of tungsten), is slidably received in the aforementioned slot and extends into the opening 34 when in operative position. In its inoperative position, the latchable lever 82 is biased against the spring 92 and held in position by the latch 86 and in this position, the pin 94 is retraced from the opening 32. At the time a wafer is inserted in the cassette assembly, the latch is disengaged by moving the latch 86 radially outwardly from the opening so as to release the latching lever 82 to allow the spring 92 to urge the point 102 into engagement with the wafer thus making the electrical contact. One purpose of pin 94 is to insure a good electrical contact so that the wafer and cassette body will be at the same electrical potential when mounted in the X-Y table and another purpose is to act as a spring loaded indexing means to urge the wafer edge 26 against the indexing means 40 for repeatable alignment of the wafer in the cassette.

Figure 7:
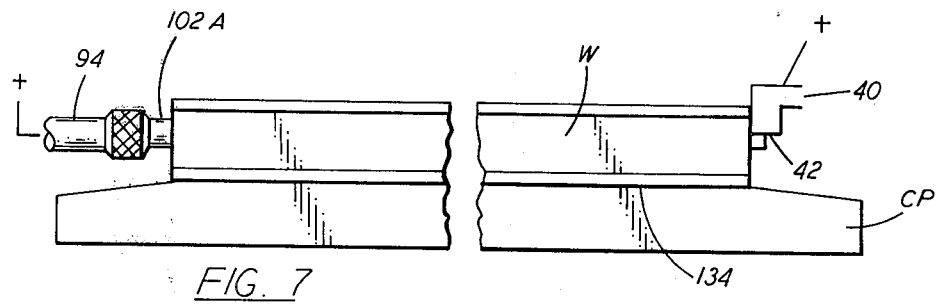
FIG. 7 is an enlarged elevational view similar to FIG. 6 but with an alternative means for the connection to an electrical potential.
Figure 8:
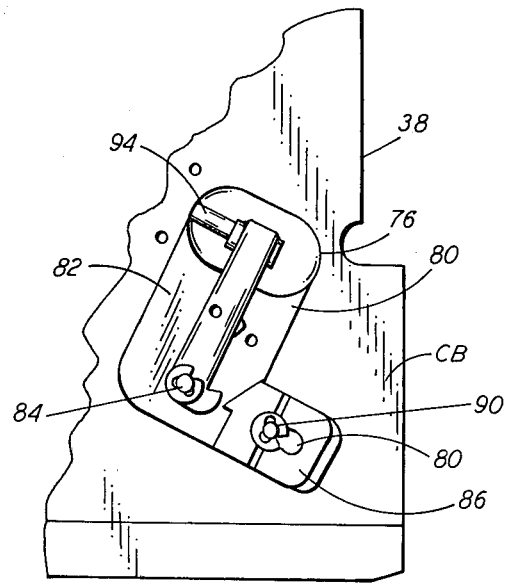
FIG. 8 is a bottom view of a portion of the cassette body illustrating in more detail the means of contacting the wafer electrically.

An alternative to the point 102 engaging the wafer is to use the spring 92 to urge means 102A (now a blunt end) into engagement with the edge of the wafer to urge the wafer against the indexing means 40. This is illustrated in FIG. 7. In this version, the edge of the wafer engaging the register points 42 and/or the register points may require etching or sanding to insure a good electrical connection between the silicon dioxide and the cassette body.

On the removal of the wafer, after processing (or for whatever reason), the pin 94 is, of course, retracted from the opening 34 by movement of the latching lever 82 against the spring 92 and by the radial inward movement of the latch 84 to engage the in latching relationship.

Now before describing the charge plate CP in detail, it should be pointed out at this time first that a plurality of recesses 106, 108 and 110 are formed on the inside wall 112 of the opening 32 to receive plastic guides 114, 116 and 118 each of which has radially inwardly directed ledges to engage the edge of the charge plate. These form means for electrically insulating the charge plate from the cassette body and are fixed to the cassette body by screws 120 and the largest of these is opposite the pin 94 so that the latter forces the wafer against this guide. Secondly, the cassette body has a pair of recesses 122 which are open towards the opening 32 and the bottom of the cassette body and connect midway of the inside wall 112 to relatively thin slots 124 which are also open into the opening 34. These slots 124 are formed parallel to the top and bottom surface of the cassette body and form, together with larger recesses 122, key ways to receive a part of the charge plate assembly which will now be described.

Figure 5:
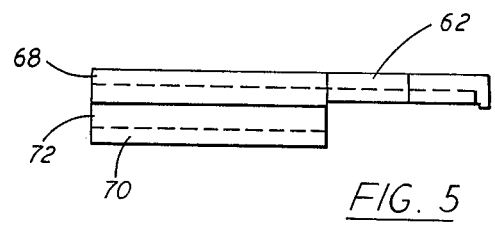
FIG. 5 is a side elevational view of one of the retainer means of FIG. 4.

The charge plate CP is circular and of a diameter to complement the diameter of the opening 34 of the cassette body. The outer periphery is provided with a plurality of small notches 126, 128 and 130 to accommodate the guide 118 to clear register pins 42 and 56 and to clear pin 94, respectively. The outer periphery of the charge plate is also chamfered slightly as at 132 to accommodate any excess mask material 128 which may have spilled over the edges of the wafer during the spinning process by which the mask material is formed on the wafer. See FIG. 5 illustrating this phenomena. The non-uniformity of the chamfer as shown in FIGS. 3 and 4 is to accommodate variations in the size of the wafers which occur during their manufacture and the edge of the wafer must be over the chamfer for all sizes. The top surface of the charge plate, in one embodiment, has a relatively thin coating 134 of dielectric material on which the wafer is placed and is also provided with a plurality of pump out grooves 136 which radiate from the center to the outer edge of the charge plate to divide the top surface into pie-shaped segments 138. These pump out grooves 136 opening at the outer edge of the charge plate, allow any gases which may be created when the work chamber 18 is pumped down to a low pressure level to escape, thus not interfere, with the flatness of the wafer. Additionally, the pump out grooves allow gases to conveniently return when the clamping forces holding the wafer are removed.

While not found to be necessary in the present usage, the pumping speed for the aforementioned gases and the rate of return flow is additionally enhanced by the shape of the pump out grooves since their shape is quite significant.

Figure 9:
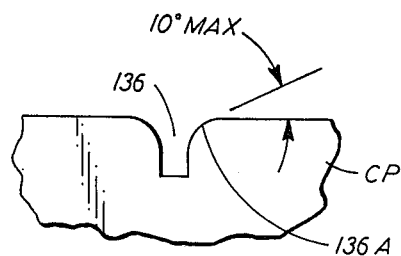
FIG. 9 is a view of a portion of the edge of a charge plate, enlarged over FIGS. 3 and 4 to illustrate the preferred version of the pump out grooves in more detail.
Figure 10:
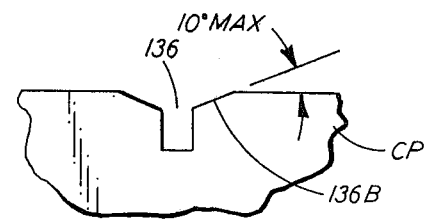
FIG. 10 is a view similar to FIG. 9 showing an alternative embodiment of the pump out grooves.

As illustrated in FIGS. 9 and 10, the transition from the top flat surface of the charge plate to the side of the grooves 136 must be very gradual (shown as a radius 136A in FIG. 9) to minimize the electrostatic field gradients in that area. It has been found out that any grooved configuration that contains a sharp corner in the area of the wafer will likely break down. This is due, first of all, to the fact that it is hard to coat a corner and the coating will likely have imperfections at the corner. Secondly, the electrostatic field gradients will be very high near the corner. The current acceptance criteria is that the angle between the top surface and the tangent to the groove radius must be less than 10°.

FIG. 10 illustrates another groove profile, such as flat surface 136B, that also meets the criteria and is acceptable.

Figure 11:
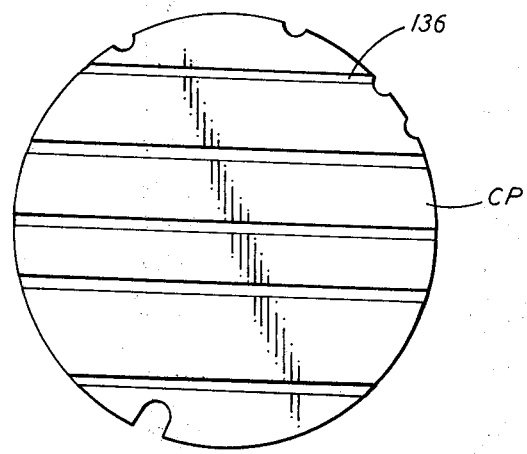
FIG. 11 illustrates another pattern of the pump out grooves formed on the charge plate.

FIGS. 3 and 4 show the radial groove orientation but this is not the only orientation that is acceptable. Any groove pattern that intercepts the outer rim of the charge plate is acceptable, such as parallel groove configuration shown in FIG. 11. Pumping grooves that intercept each other to form a checkerboard pattern on the top surface will also work provided that they intercept the edge of the wafer but can create a manufacturing problem. The problem is that as the machine cuts across a pre-cut groove, the machine tends to leave a burr on the pre-cut groove that is crossed. The burrs are hard to coat and again create high electrostatic field potential. While the burrs can be removed, the high electrostatic field gradients will still be created at the corners where the grooves intercept.

Figure 12:
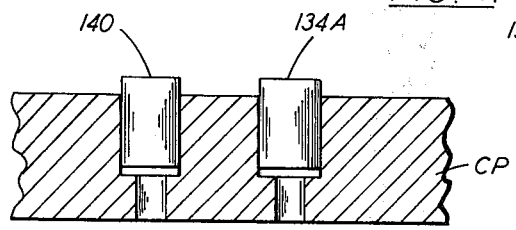
FIG. 12 illustrates another manner in which the top surface of the charge plate may be provided with a means to support the wafer.
Figure 13:
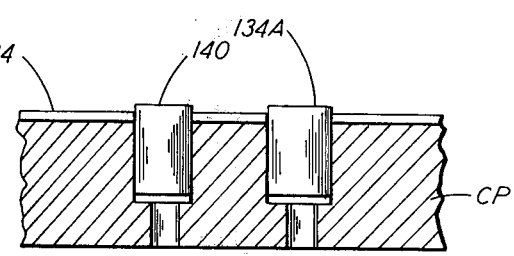
FIG. 13 shows the combination of the dielectric coating of FIGS. 3 and 4 and the pins of FIG. 12 as a support means for the wafer.

Turning now to FIGS. 12 and 13, there is disclosed an alternate manner of supporting the wafers on the charge plate. This way avoids problems of coating the layer. In the embodiment disclosed, the charge plate is provided with a plurality of bores 140, preferably counterbored or stepped midway of the thickness of the charge plate, and provided with a plurality of pins 134A of a nonconducting material embedded in the bores of the charge plate. Bores 140 being throughbores, allow gas to escape from beneath the pins 134A out through the bottom of the charge plate. These pins (20 to 40 in number) are pressed into the bores in the charge plate and then suitably formed, as by grinding, to within approximately 0.001 inch of the metallic charge plate surface. The flatness of the top surface of the pins are formed (ground) flat to within approximately 0.001 inch of the surface flatness. The charge plate itself in this embodiment is not as significant as the embodiment with the coating 134. It is to be noted in this embodiment as well as that shown in FIG. 13 that the pins are given the same reference numeral as a coating in the prior Figures since it performs the same function, that is, supports the wafer and provides the dielectric between the two charged members, the wafer and the charge plate, for the Coulomb effect.

FIG. 13 shows the combination of a dielectric layer 134 plus the pins 134A. In this case again, the wafers are ground to within 0.001 inch of the top of the coating. Again, as in the prior embodiments, the combination of the pins and the coating form the dielectric between the two charged members for the Coulomb effect to take place.

For a given desired wafer surface flatness X (total minimum separation of two theoretical parallel reference planes, within the given surface can fit), the dielectric top surface whether coating 134 or the top of pins 134A (considered as a group) must have a corresponding flatness of X or smaller. Further, in order to provide a uniform electrostatic clamping force, the dielectric must be of a uniform thickness. Finally, in order that a not impractical value of applied potential difference be necessary, the dielectric coating, or pin exposure, above the top surface of the charge plate (or coating as in the case of FIG. 13) must be thin. A coating thickness or pin exposure can be conventionally in the range of 10 to 100 micrometers, while the variation must be in a range below 20% of the thickness of the coating or pin exposure length.

Figure 14:
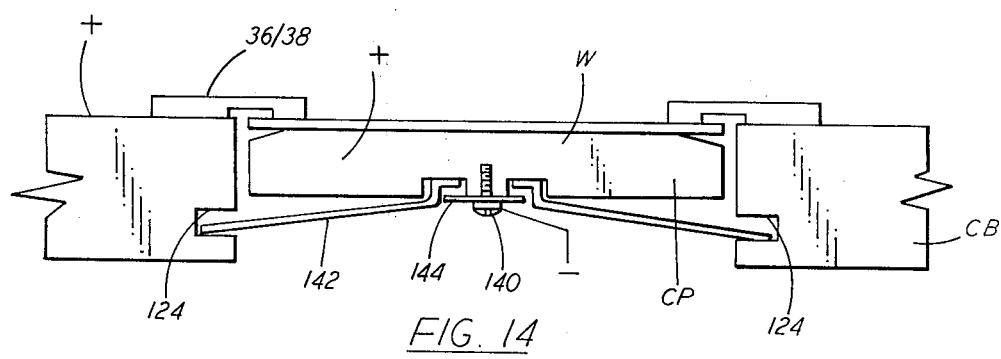
FIG. 14 is an elevational view of the wafer and charge plate as held in position in the cassette body.

The bottom of the charge plate, that is the side opposite the coating, and/or pins is provided with a screw 142 which forms an electrical coupling for connection to a suitable potential. This screw also attaches a leaf spring 144 to the bottom of the charge plate but is electrically insulated therefrom by nonconductive washers 146 (three shown). The leaf spring is connected at the center near the electrical coupling radially outwardly beyond the edge of the charge plate so that the tips thereof can engage the key ways defined by the recesses 122 and the radial slots 124. See FIG. 14.

To load the cassette, the cassette body is placed with its top surface face down, and a wafer is placed in the opening with its coated surface also facing downwardly. The charge plate with its top coated surface is then placed in engagement with the bottom of the wafer. Thereafter, the charge plate is forced against the wafer by the insertion of the tips of the leaf spring 144 into the aforementioned recesses 122 and turned clockwise to secure the tips of the spring in the key way slots 124, thereby fixing the wafer in the cassette. The force imposed on the charge plate by the spring, in the disclosure embodiment is approximately 3 lbs.

Figure 6:
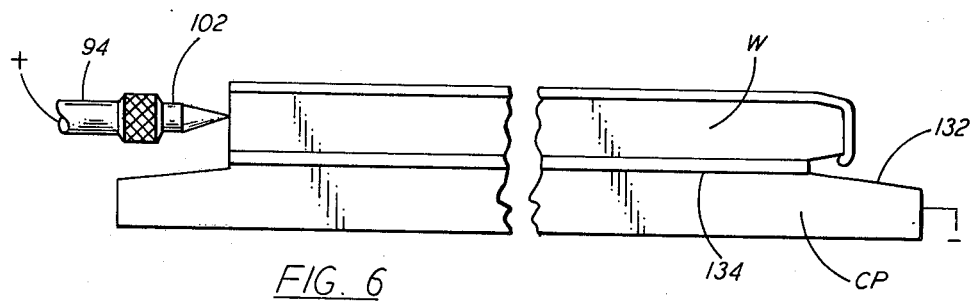
FIG. 6 is an enlarged elevational view of a wafer as placed on a charge plate and connected to an electrical potential.

Thereafter, the spring loaded indexing means, pin 94, is made operative (unlatched) to urge the wafer into engagement with the indexing means 40 (points 42) thereby aligning the wafer in the cassette. The wafer can also be registered with vacuum tweezers or a probe. This engagement of the pointed end 102 of the pin 94 with the wafer edge makes electrical contact with the wafer itself thereby connecting the wafer and cassette body electrically together. This is illustrated in detail in FIG. 6. If the alternative embodiment of FIG. 7 is used, the blunt end 102A spring biases the wafer against the points 2 where electrical contact with the cassette body is made.

Finally, the cassette and wafer are connected to a source of potential opposite in polarity to the potential applied to the bottom of the charge plate to provide the Coulomb forces across the coating 134 or pins 134A, or the combination of coating 134 and pins 134A as the case may be, to flatten the wafer against the charge plate. In the preferred embodiment, the potentials are applied after the cassette with a mechanically held wafer has been transferred into the particle beam lithography system work chamber at the working vacuum (very low air pressure, approximately 0.01 pascal or lower). Prior to the removal of the cassette with the held wafer, the potentials are again removed, in order to remove the electrostatic holding means. This sequential procedure prevents unwanted electrical charges, for example, from Paschen's Law Phenomena or from inadvertent defects in the dielectric insulating layer or pins. Further, since leakage charges can accumulate more easily at nearly atmospheric pressures and thus weaken the clamping force, this latter effect is also avoided. Finally, the procedure further enhances gas removal and replacement means.

Although not found necessary in the present embodiment, an alternating square wave voltage could be applied as described in the cited Wardly article in place of the DC potentials.

From the foregoing, it can be seen that there is disclosed a cassette which uses electrostatic force to flatten a wafer in combination with mechanical force. The wafer is flattened to a total indicated read out of 10 micrometers with a maximum deviation from the vertical plane (beam focal point) of 5 micrometers and the wafer is repeatedly located in the cassette in the horizontal plane within 50 micrometers.

What is claimed is:

1. An electrostatic cassette assembly for securing and positioning a wafer in a particle beam lithography system so that the upper surface of the wafer is exposed to the particle beam, comprising, a cassette body having a central opening for receiving said wafer, retainer means secured in fixed relationship and extending into said opening, a charge plate fabricated with extreme flatness with a top surface having a relatively thin dielectric formed to be extremely uniform on which the wafer is positioned so that the bottom surface of the wafer engages the dielectric, holding means cooperable with said cassette body to force said wafer into contact with said retaining means whereby the wafer is held rigidly in said cassette assembly, and, means for applying a first potential to the wafer and a second potential of a different value to said charge plate on the side opposite said charge plate from said dielectric to flatten said wafer by Coulombic force whereby the wafer is held both mechanically and electrostatically in said cassette assembly.

2. The electrostatic cassette assembly as claimed in claim 1 wherein said dielectric comprises a coating extending across substantially the entire surface of the charge plate.

3. The electrostatic cassette assembly as claimed in claim 2 wherein said dielectric further includes pin means of nonconductive material extending above said coating.

4. The electrostatic cassette assembly as claimed in claim 1 wherein said dielectric comprises pin means positioned in and extending above the top surface of said charge plate.

5. The electrostatic cassette assembly as claimed in claim 1 wherein said retainer means comprises fingers fixedly secured to the top surface of the cassette body.

6. The electrostatic cassette assembly as claimed in claim 1 wherein the top surface of said charge plate is provided with at least one pump out groove to allow any residual gas which may otherwise accumulate in the area between the bottom of the wafer and the top surface of the charge plate to escape and permitting gases to return after release of the clamping force of the holding means.

7. The electrostatic cassette assembly as claimed in claim 6 wherein said top surface is provided with a plurality of pump out grooves which extend radially to the edge of said top surface to define said top surface in pie-shaped segments.

8. The electrostatic cassette assembly as claimed in claim 6 wherein said top surface is provided with a plurality of pump out grooves which extend from edge to edge of said top surface.

9. The electrostatic cassette assembly as claimed in claim 1 wherein said means cooperable with said cassette body to force the wafer into contact with the retaining means comprising a leaf spring attached to the bottom surface of said charge plate, key ways in said cassette body, said spring means engaging said key ways in said cassette body.

10. The electrostatic cassette assembly as claimed in claim 1 wherein said means for applying a first potential to the wafer includes a retractable pin which engages the wafer when the latter is held in said assembly.

11. The electrostatic cassette assembly as claimed in claim 10 wherein said pin is spring biased in operative position against the wafer.

12. In a particle beam lithographic system having a focused particle beam capable of being directed to a workpiece for writing predetermined configurations thereon,
  said beam being movable in X and Y directions across said workpiece,
  a movable supporting table on which said workpiece is placed and capable of moving in a direction X at right right angles to the movement of said particle beam to provide scanning of said workpiece by said particle electron beam in both the X and Y directions,
  cassette means having holding means for clamping said workpiece mechanically in said cassette while supported on said table,
  said workpiece being supported on a dielectric which is affixed to a charge plate mechanically clamped in said cassette means before being placed in said work table,
  said cassette means having means for aligning said cassette means with alignment means in said table,
  said system including chamber means in which the pressure in the area around said table and cassette is reduced to a very low pressure,
  means for applying a potential difference between the workpiece and said charge plate to clamp said workpiece electrostatically in said cassette after the pressure in said chamber has been reduced,
  said charge plate having means for allowing any residual gas beneath said wafer to escape,
  means for disconnecting said potential difference before said pressure in said work chamber is returned to ambient pressure and for allowing gases to return beneath said wafer.

13. The electrostatic cassette assembly as claimed in claim 1 wherein the electric potentials applied constitute an electric square wave with suitable short transition times.

14. The electrostatic cassette assembly as claimed in claim 12 whereby the electric potentials applied constitute an electric square wave with suitable short transition times.

* * * * *

UNITED STATES PATENT AND TRADEMARK OFFICE
CERTIFICATE OF CORRECTION

PATENT NO. : 4,412,133
DATED : 10/25/83
INVENTOR(S) : W. A. Eckes, R. H. Rhoades, J. W. Vorieter,
J. C. Wiesner and C. E. Shepard It is certified that error appears in the above-identified patent and that said Letters Patent are hereby corrected as shown below:

Column 2, line 29, delete "view", (second occurrence).

Column 9, line 9, delete "electron".

Signed and Sealed this

First Day of May 1984

[SEAL]

Attest:

GERALD J. MOSSINGHOFF

Attesting Officer    Commissioner of Patents and Trademarks